(12) United States Patent
Khalaf et al.

(10) Patent No.: US 11,373,974 B2
(45) Date of Patent: Jun. 28, 2022

(54) ELECTRONIC DEVICE PACKAGES AND METHODS FOR MAXIMIZING ELECTRICAL CURRENT TO DIES AND MINIMIZING BOND FINGER SIZE

(71) Applicant: Intel Corporation, Santa Clara, CA (US)

(72) Inventors: Bilal Khalaf, Folsom, CA (US); Mao Guo, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 566 days.

(21) Appl. No.: 16/306,879

(22) PCT Filed: Jul. 1, 2016

(86) PCT No.: PCT/US2016/040868
§ 371 (c)(1),
(2) Date: Dec. 3, 2018

(87) PCT Pub. No.: WO2018/004695
PCT Pub. Date: Jan. 4, 2018

(65) Prior Publication Data
US 2021/0074668 A1   Mar. 11, 2021

(51) Int. Cl.
*H01L 23/00* (2006.01)
*H01L 25/065* (2006.01)

(52) U.S. Cl.
CPC .............. *H01L 24/49* (2013.01); *H01L 24/48* (2013.01); *H01L 24/85* (2013.01); *H01L 25/0657* (2013.01); *H01L 2224/48227* (2013.01); *H01L 2224/49112* (2013.01); *H01L 2225/0651* (2013.01); *H01L 2225/06562* (2013.01)

(58) Field of Classification Search
CPC .......... H01L 24/49; H01L 24/48; H01L 24/85
See application file for complete search history.

(56) References Cited

U.S. PATENT DOCUMENTS

| | | | |
|---|---|---|---|
| 8,436,450 B2 * | 5/2013 | Menon | H01L 23/66 257/664 |
| 2005/0148175 A1 | 7/2005 | Yand et al. | |
| 2005/0205995 A1 | 9/2005 | Ishikawa et al. | |

(Continued)

OTHER PUBLICATIONS

International Search Report and Written Opinion from International Patent Application No. PCT/US20156/040868, dated Jan. 10, 2019, 13, pgs.

(Continued)

*Primary Examiner* — Errol V Fernandes
(74) *Attorney, Agent, or Firm* — Schwabe, Williamson & Wyatt P.C.

(57) ABSTRACT

Electronic device package technology is disclosed. In one example, an electronic device includes a substrate having a bond finger, a die coupled to the substrate and having a bond pad, a first bond wire coupled between the bond pad and the bond finger, and a second bond wire coupled between the bond pad and the bond finger. The first bond wire is reverse bonded between a pad solder ball on the bond pad and a finger solder ball on the bond finger. The second bond wire is forward bonded between a supplemental pad solder ball on the pad solder and the bond finger adjacent the finger solder ball. Associated systems and methods are also disclosed.

18 Claims, 8 Drawing Sheets

(56) References Cited

U.S. PATENT DOCUMENTS

2007/0273043 A1* 11/2007 Pendse .................. H01L 24/85
  257/762
2012/0038059 A1  2/2012 Chin et al.
2014/0008796 A1  1/2014 Choi
2014/0124565 A1  5/2014 Haba et al.

OTHER PUBLICATIONS

Office Action from Taiwan Patent Application No. 106116860, dated Aug. 27, 2020, 9 pgs.
Notice of Allowance from Taiwan Patent Application No. 106116860, dated Mar. 3, 2021, 3 pgs.
PCT Application No. PCT/US2016/040868, Filing date Jul. 1, 2016, Bilal Khalaf International Search Report; dated Apr. 26, 2017; 14 Pages.

* cited by examiner

ELECTRONIC DEVICE PACKAGES AND METHODS FOR MAXIMIZING ELECTRICAL CURRENT TO DIES AND MINIMIZING BOND FINGER SIZE

PRIORITY INFORMATION

This application is a 371 U.S. national stage entry of PCT Application Serial No. PCT/US2016/040868, filed Jul. 1, 2016, which is incorporated herein by reference in its entirety.

TECHNICAL FIELD

Embodiments described herein relate generally to electronic device packages, and methods of electrically coupling a die to a substrate.

BACKGROUND

Semiconductor packages and devices that house such packages are getting progressively smaller. Therefore, package size requirements are shrinking while electrical supply requirements to electronic components remain the same or increase.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

Figure 1A:
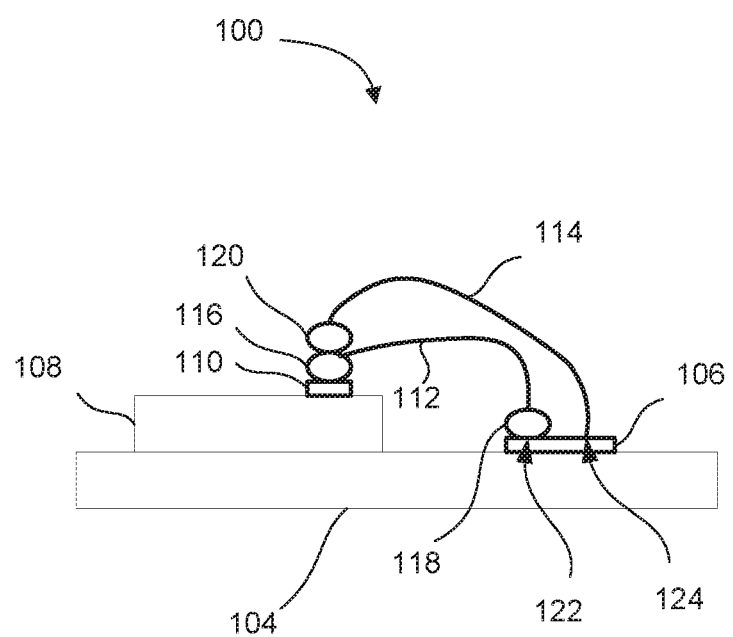
FIG. 1A shows an electronic device package in accordance with an example.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" include support for plural referents unless the context clearly dictates otherwise. Thus, for example, reference to "a layer" includes support for a plurality of such layers.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

As used herein, the term "bond pad solder ball" refers to a solder ball that is located closer in physical proximity to the bond pad of a die, than to a bond finger of a substrate. In one embodiment, a bond pad solder ball may be directly coupled to a bond pad of a die.

As used herein, the term "bond finger solder ball" refers to a solder ball that is located closer in physical proximity to the bond finger of a substrate, than to a bond pad of a die. In one embodiment, a bond finger solder ball may be directly coupled to a bond finger of a substrate.

The terms "first," "second," "third," "fourth," and the like in the written description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the written description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. "Directly coupled" is defined as actual physical contact between two objects, structures, or items. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. It is understood that express support is intended for exact numerical values in this specification, even when the term "about" is used in connection therewith.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de factor equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Example Embodiments

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

Electronic devices packages, which minimize a bond finger size while maximizing electrical current, supplied to an associated die are disclosed. In one example, an electronic device package can include a substrate having a bond finger, a die coupled to, or otherwise associated with, the substrate and having a bond pad, a first bond wire coupled between the bond pad and the bond finger, and a second bond wire coupled between the bond pad and the bond finger. In some examples, at least one of the bond wires is coupled to the bond pad with a bond pad solder ball. In some examples, both of the bond wires are coupled to the bond pad with a bond pad solder ball. In some examples, at least one of the bond wires is coupled to the bond finger with a bond finger solder ball. In some examples, both of the bond wires are coupled to the bond finger with a bond finger solder ball. In some examples, at least one of the bond wires is directly coupled to the bond finger. In some examples, the first bond wire is coupled to the bond pad with a first bond pad solder ball and the second bond wire is coupled to the bond pad with a second bond pad solder ball. In some examples, the second bond pad solder ball is coupled to the first bond pad solder ball. In some examples, the second bond pad solder ball does not directly contact the bond pad. In some examples, a second die can be coupled to, or otherwise associated with, the substrate and have a bond pad and a first bond wire coupled between the second die bond pad and the bond finger. In some examples, a second bond wire can be coupled between the second die bond pad and the bond finger. In some examples, at least one of the bond wires is coupled to the second die bond pad with a bond pad solder ball. In some examples, both of the bond wires are coupled to the second die bond pad with a bond pad solder ball.

In one example, an electronic device comprises, a substrate having a bond finger, a first die coupled to the substrate and having a first die bond pad, a second die coupled to the substrate and having a second die bond pad, a first bond wire coupled between the first die bond pad and the bond finger, and a second bond wire coupled between the second die bond pad and the bond finger at substantially the same location as the first bond wire.

Figure 1B:
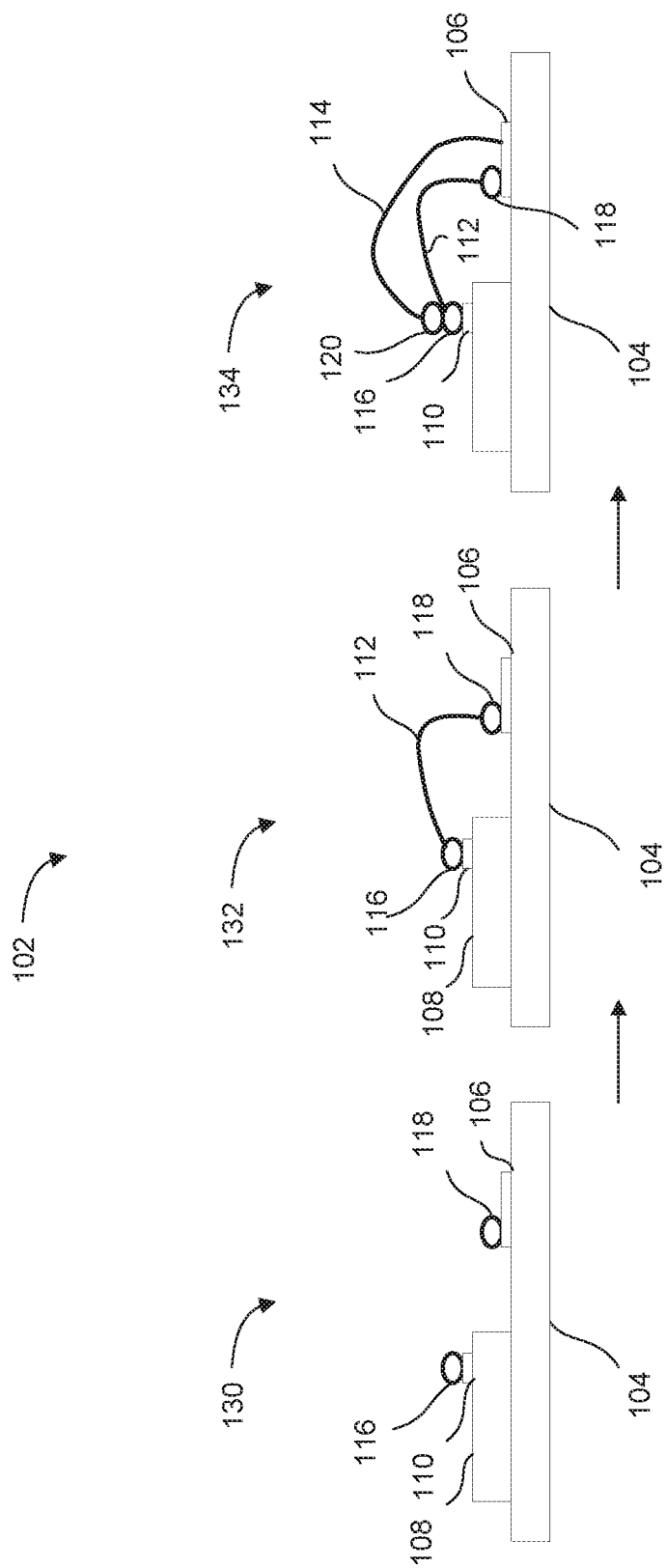
FIG. 1B shows an process for electrically coupling a die and a substrate in accordance with an example.

Referring to FIGS. 1A and 1B, an electronic device 100 and a process 102 for making the electronic device 100 are disclosed according to an example. The device 100 can include a substrate 104 having a bond finger 106. A die 108 having a bond pad 110 can be disposed on the substrate 104. A first bond wire 112 can be electrically coupled between the bond pad 110 and the bond finger 106. A second bond wire 114 can be electrically coupled between the bond pad 110 and the bond finger 106. Thus, a single die is electrically coupled from a bond pad (e.g. a single bond pad) to a bond finger (e.g. a single bond finger) via first and second bond wires to maximize electrical current to the die.

In some examples, the primary bond wire 112 is reverse bonded between a first bond pad solder ball 116 on the bond pad 110 and a first bond finger solder ball 118 on the bond finger 106. In some examples, the second bond wire 114 is forward bonded between a second bond finger solder ball 120 and the bond finger 106. The second bond wire 114 can be directly soldered to the bond finger 106. The bond finger solder ball 118 may be disposed on a first location 122 and the second bond wire 114 may be terminated at a second location 124 adjacent the first location 122. The second bond pad solder ball 120 is not in direct contact with the bond pad 110, as illustrated on FIG. 1A and elsewhere. Throughout the present disclosure, reference may be given to "a ball" which can be any solder ball as described therein, such as a "bond pad solder ball" or "bond finger solder ball."

FIG. 1B illustrates an example process 102 for making the electronic device 100 of FIG. 1A. The process 102 may include providing a substrate 104 with a die 108 coupled thereto, associated therewith, or otherwise disposed thereon. In some embodiments, the die can be directly coupled to the substrate 104. In step 130, a first bond pad solder ball (e.g. a solder ball on the bond pad) 116 can be deposited on the bond pad 110 of the die 108 and a first bond finger solder ball (e.g. a solder ball on the bond finger) 118 can be deposited on the bond finger 106. Step 132 may include reverse bonding a first bond wire 112 between the first bond pad solder ball 116 and the first bond finger solder ball 118. In one embodiment, a reverse bond is created by depositing the solder balls 116, 118 and then running a wire from the first bond finger solder ball 118 to the bond pad solder ball 116. Step 134 may include disposing a second bond pad solder ball 120 directly on the first bond pad solder ball 106 (and not in direct contact with the bond pad 110). The wire 114 is then coupled between the second bond pad solder ball 120 and the bond finger. In one embodiment, the wire 114 can be forward bonded by attaching the wire to the second bond pad solder ball 120 and then coupling the wire directly to the bond finger 106. As an alternative, the second bond wire could be reverse bonded between the bond finger and the bond pad. In such case, the configuration would include a second bond finger solder ball (not shown). A similar process can be used to make electronic assemblies or devices of the present disclosure, such as with reference to the assemblies or devices of FIGS. 3 and 4.

Figure 2:
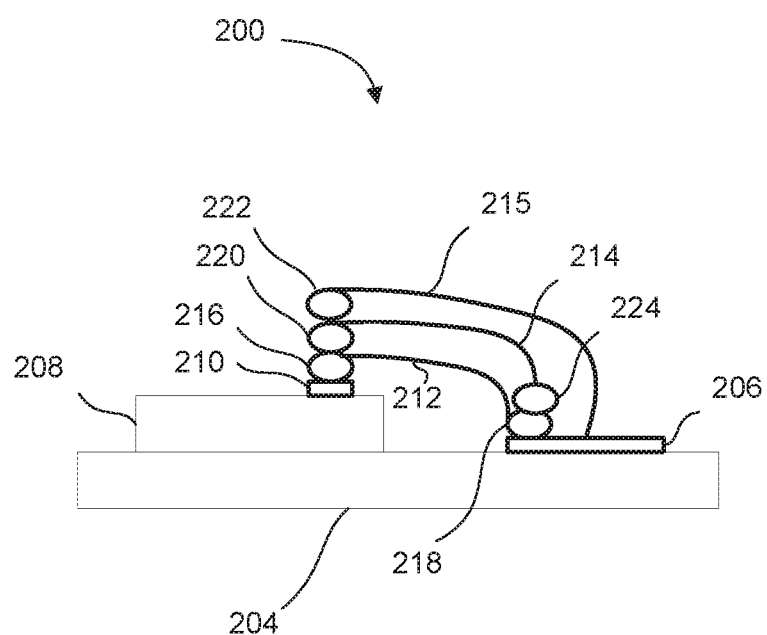
FIG. 2 shows an electronic device package in accordance with an example.

FIG. 2 illustrates an electronic device 200 according to an example. The device 200 can include a substrate 204 having a bond finger 206. A die 208 having a bond pad 210 can be disposed on the substrate 204. A first bond wire 212 can be electrically coupled between the bond pad 210 and the bond finger 206. A second bond wire 214 can be electrically coupled between the bond pad 210 and the bond finger 206. A third bond wire 215 can be electrically coupled between the bond pad 210 and the bond finger 206. In this example, a plurality of bond pad solder balls are stacked on the bond pad 210 of the die 208, namely first bond pad solder ball 210, second bond pad solder ball 216, and third bond pad solder ball 222. Likewise, a plurality of bond finger solder balls are stacked on the bond finger 206, namely first bond finger solder ball 218 and second bond finger solder ball 224. Thus, the first bond wire 212 is coupled (and reverse bonded) between first bond pad solder ball 216 and first bond finger solder ball 218, and the second bond wire 214 is coupled (and reverse bonded) between second bond pad solder ball 220 and second bond finger solder ball 224, and the third bond wire 215 is coupled (and forward bonded) between the third bond pad solder ball 222 and the bond finger 206 and is directly coupled to the bond finger. Notably, first bond finger solder ball 218 and second bond finger solder ball 224 need not be in a stacked configuration, but rather could both be directly coupled to the bond finger. However, the stacking arrangement can reduce the amount of space required to effectively couple bond wires 212 and 214 to the bond finger 206, and thus may allow the bond finger 206 to be comparatively reduced in size, thus making space for other devices or structures on the substrate 204.

Figure 3:
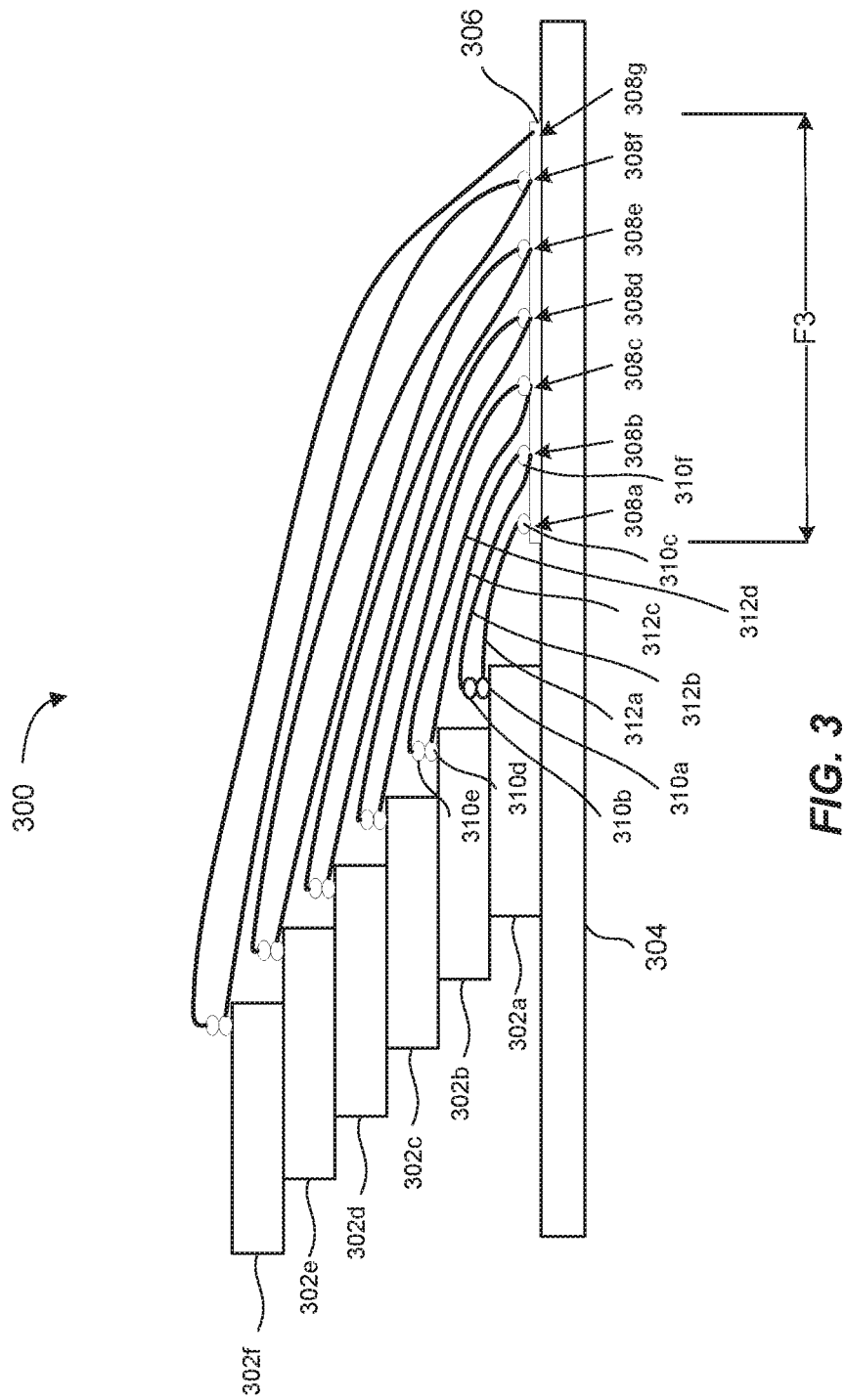
FIG. 3 shows an electronic device package in accordance with an example.

FIG. 3 illustrates an electronic device 300 according to an example. A plurality of dies 302a-f is stacked on a substrate 304. A bond finger 306 is disposed on the substrate 304 and includes a plurality of bond locations 308a-g. Each die 302 may have a similar structure as described with reference to the device and processes of FIGS. 1A and 1B. For example, a first die 302a may include a first bond pad ball 310a and a second bond pad ball 310b disposed on the first bond pad ball 310a, which may be disposed on a bond pad (FIG. 1A). A first bond finger ball 310c can be disposed on a first location 308a of the bond finger 306. A first bond wire 312a can be electrically coupled between the first bond pad ball 310a and the first bond finger ball 310c at location 308a. A second bond wire 312b can be electrically coupled between the second bond pad ball 310b and a second location 308b of the bond finger 306. Likewise, a second die 302b stacked adjacent the first die 302a can have a third bond pad solder ball 310d and a stacked fourth bond pad solder ball 310e, and location 308b can have a second bond finger solder ball 310f. A third bond wire 312c can be electrically coupled between the second bond pad solder ball 310d and the second bond finger solder ball 310f. Likewise, a fourth bond wire 312d can be electrically coupled between the third bond finger solder ball 310e and a third location 308c. Effectively, two bond wires, one from one die and one from an adjacent die can share a same location on the bond finger. A process of making the device 300 may continue this pattern for a plurality of dies such that each die has effectively double the electrical current supplied to its bond pad through two wires as compared a single wire for electrical supply, all while reducing a size F3 of the bond finger relative to the amount of electricity supplied to the dies on the substrate. In other words, it would normally require a bond finger at least double the size of bond finger 306 to supply the amount of electricity provided to the dies by the device of FIG. 3.

As an example of a particular bonding process at a particular bond finger location, the second bond wire 312b may be initially directly soldered (and forward bonded) to the bond finger 306, and then the second bond finger solder ball 310f can be disposed on the end of the bond wire 312b at location 308b, whereby the third bond wire 312c is reverse bonded between the third bond pad solder ball 310d and the second bond finder solder ball 310f.

Figure 4:
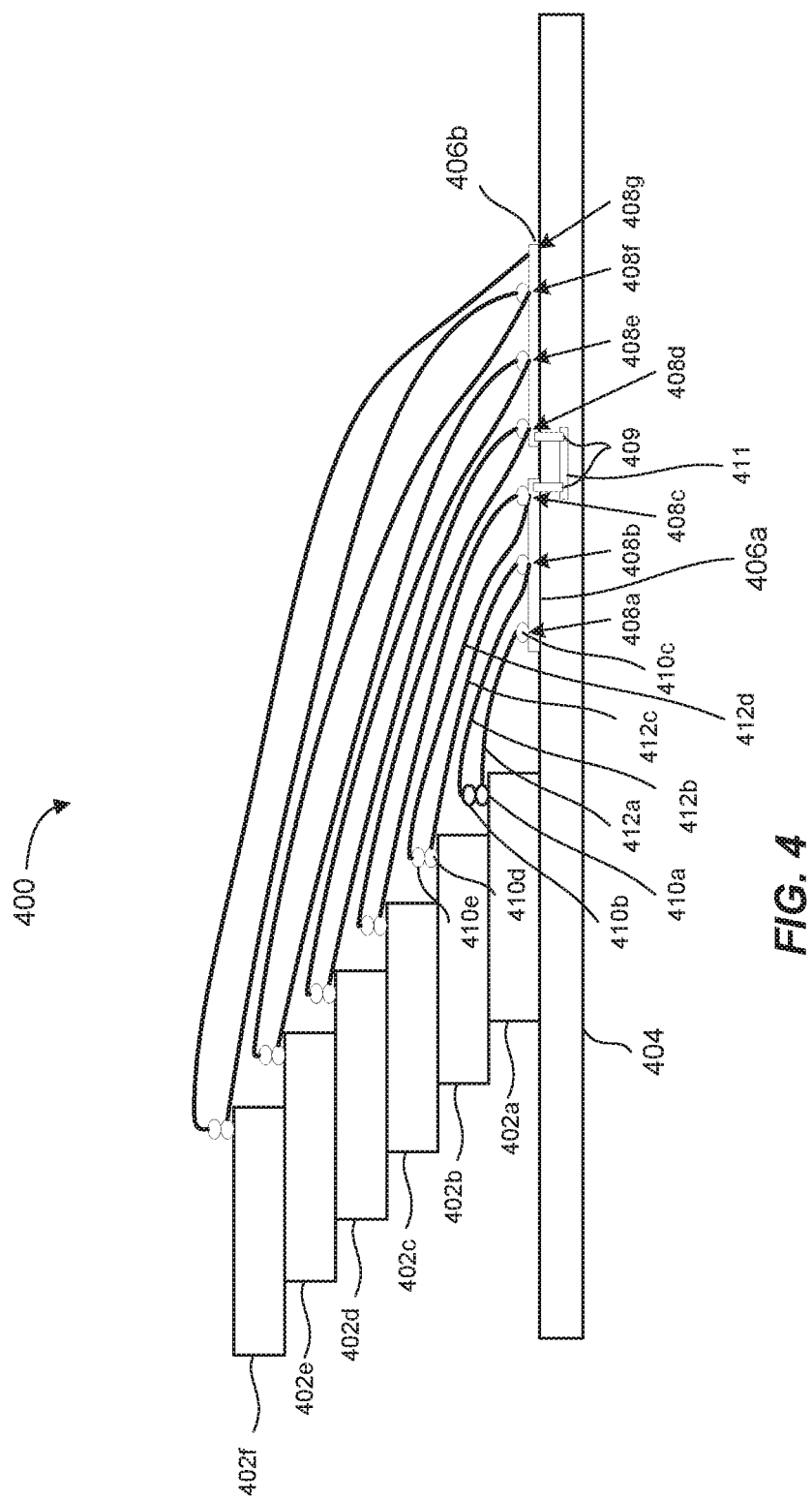
FIG. 4 shows an electronic device package in accordance with an example.

FIG. 4 illustrates an electronic device 400 according to an example. A plurality of dies 402a-f is stacked on a substrate 404. A primary bond finger 406a is disposed on the substrate 404 adjacent a secondary bond finger 406b. The primary bond finger 406a is electrically coupled to the secondary bond finger 406b by a pair of vias 409 coupled together by a trace layer 411 and to respective bond fingers 406a, 406b. The primary bond finger 406a includes a plurality of locations 408a-c and the secondary bond finger 406b includes a plurality of locations 408d-g. Each die 402 may have a similar structure as described with reference to the device of FIGS. 1A and 3. As shown, dies 402a-c can be coupled to the primary bond finger 406a and dies 402c-f can be coupled to the secondary bond finger 406b similar to the configuration of the coupling of balls and bond wires with reference to the device of FIG. 3.

Figure 5:
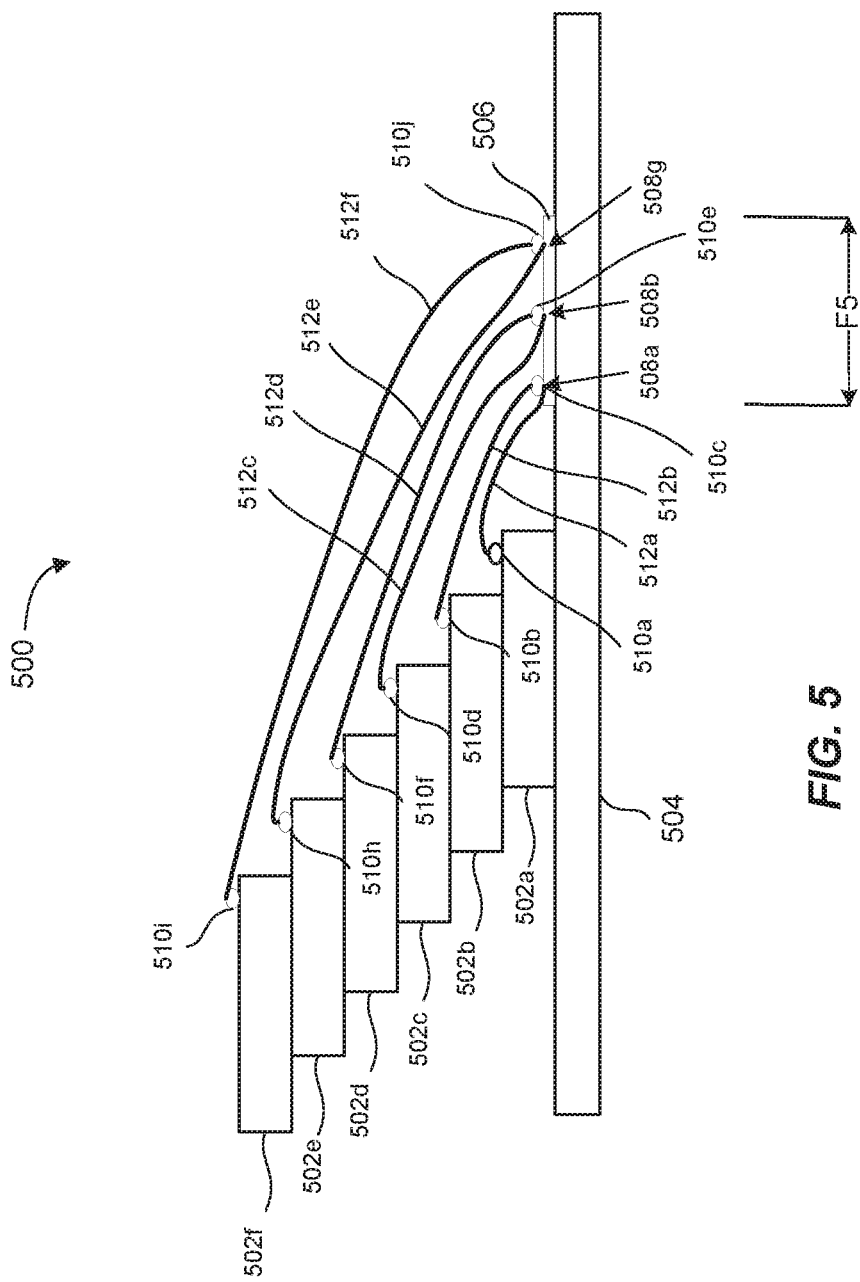
FIG. 5 shows an electronic device package in accordance with an example.

FIG. 5 illustrates an electronic device 500 according to an example. Generally, the device 500 illustrates a process and device that minimizes a size of a bond finger on a substrate without reducing a number of dies coupled thereto. Because of the sharing of contact locations on the bond finger between wire bonds from adjacent dies, the number of electrical contact points on a bond finger can be at least half of the number of dies of a stack of dies. Inversely, the number of dies can be at least double the number of contact locations on a bond finger in the example of FIG. 5.

The device 500 can include a substrate 504 having a bond finger 506. A plurality of dies 502a-f can be stacked on the substrate 504. A first die 506a can have a bond pad with a first bond pad solder ball 510a disposed thereon, and a second die 505b can have a bond pad with a second bond pad solder ball 510b disposed thereon. The bond finger 506 can have a first bond finger solder ball 510c. A first bond wire 512a can be coupled (forward bonded) between the first bond pad solder ball 510a and a first location 508a proximate the second bond finger solder ball 510c. A second bond wire 510b can be coupled (reverse bonded) between the second bond pad solder ball 510b and the first bond finger solder ball 510c. Thus, a pair of adjacent dies (e.g., 502a and 502b) can be coupled to a single contact location (e.g., location 508a) on the bond finger 506. The first bond wire 512a can be soldered directly to the bond finger 506, and then the first bond pad solder ball 510c can be soldered onto the end of the first bond wire 512c at location 508a. Likewise to the first and second dies on the substrate, dies 502c and 502d are electrically coupled to a second location 508b adjacent the first location 508a by a third wire bond 510c and a fourth wire bond 512d. A process of making the device 500 may continue this pattern for a plurality of dies (e.g., 502a-f) such that each die has electrical current supplied to its ball (e.g., 510a, b, d, f, h, i) through a bond wire (e.g., 512a-f) while reducing a size F5 of the bond finger relative to the amount of dies on the substrate. In other words, it would normally require a bond finger at least double the size of bond finger 506 to supply the electricity to the amount of dies of the device on FIG. 5.

Figure 6:
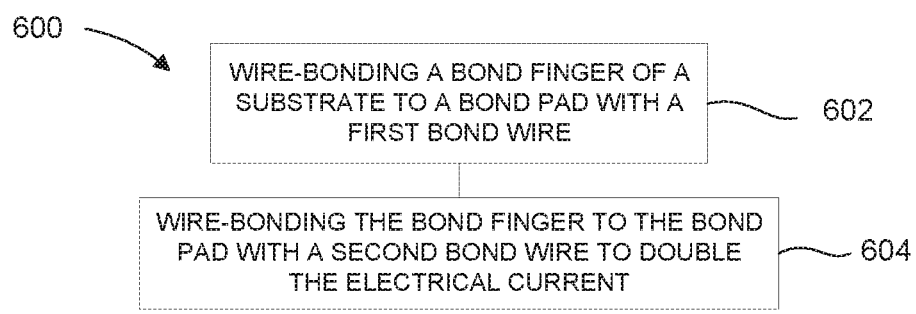
FIG. 6 shows a method of making an electronic device package in accordance with an example.

FIG. 6 shows a method 600 for making an electronic device, which may include step 602 of wire-bonding a bond finger of a substrate to a bond pad of a die with a first bond wire. Step 604 may include wire-bonding the bond finger to the bond pad with a second bond wire to effectively double the electrical current to the die while minimizing the bond finger size.

Figure 7:
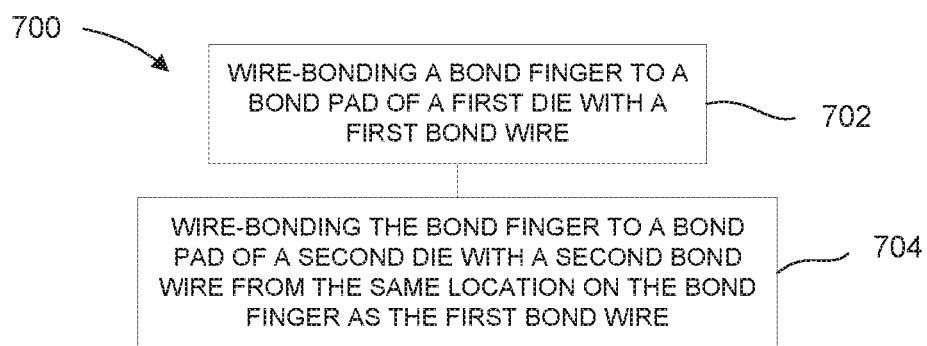
FIG. 7 shows a method of making an electronic device package in accordance with an example.

FIG. 7 shows a method 700 for making an electronic device, which may include step 702 of wire-bonding a bond finger of a substrate to a bond pad of a first die with a first bond wire. Step 704 may include wire-bonding the bond finger to a bond pad of a second die with a second bond wire sharing the same, or substantially the same, attachment location on the bond finger as the first bond wire to minimize the bond finger size.

Figure 8:
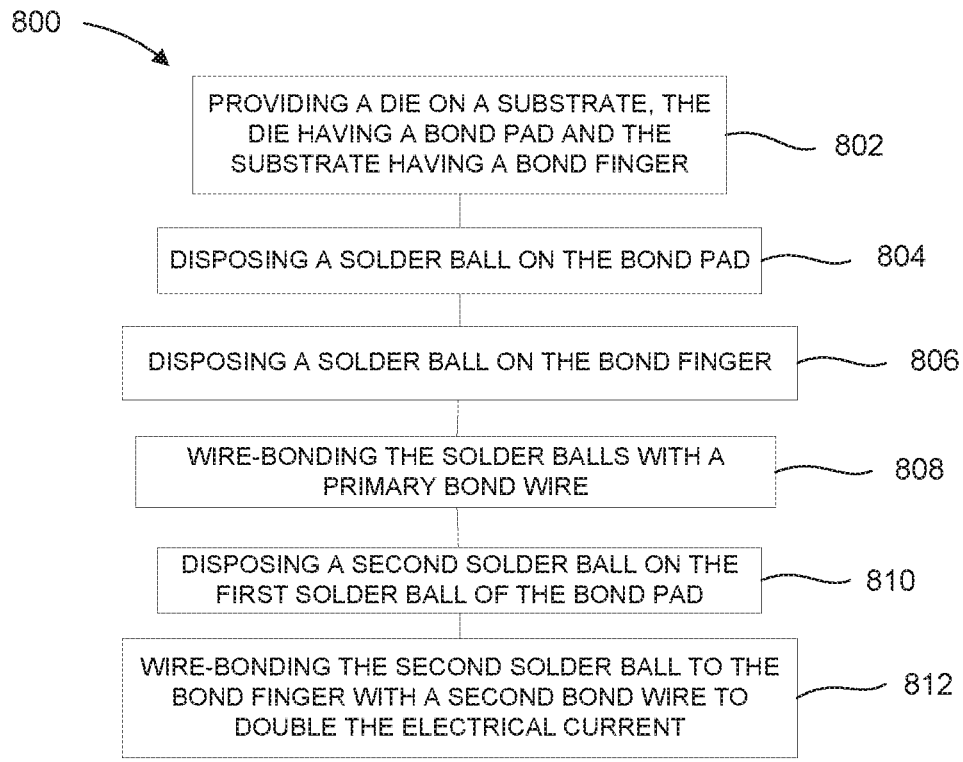
FIG. 8 shows a method of making an electronic device package in accordance with an example.

FIG. 8 shows a method 800 for making an electronic device, which may include step 802 of providing a die having a bond pad on a substrate having a bond finger. Step 804 may include disposing a first bond pad solder ball on the bond pad, and step 806 may include disposing a first bond finger solder ball on the bond finger. Step 808 may include wire-bonding the bond pad and bond finger solder balls with a primary wire. Step 810 may include disposing a second bond pad solder ball on the first bond pad solder ball, and step 812 may include wire-bonding the second bond pad solder ball to the bond finger with a second wire to double the electrical current, and in some embodiments, also to minimize the bond finger size.

Figure 9:
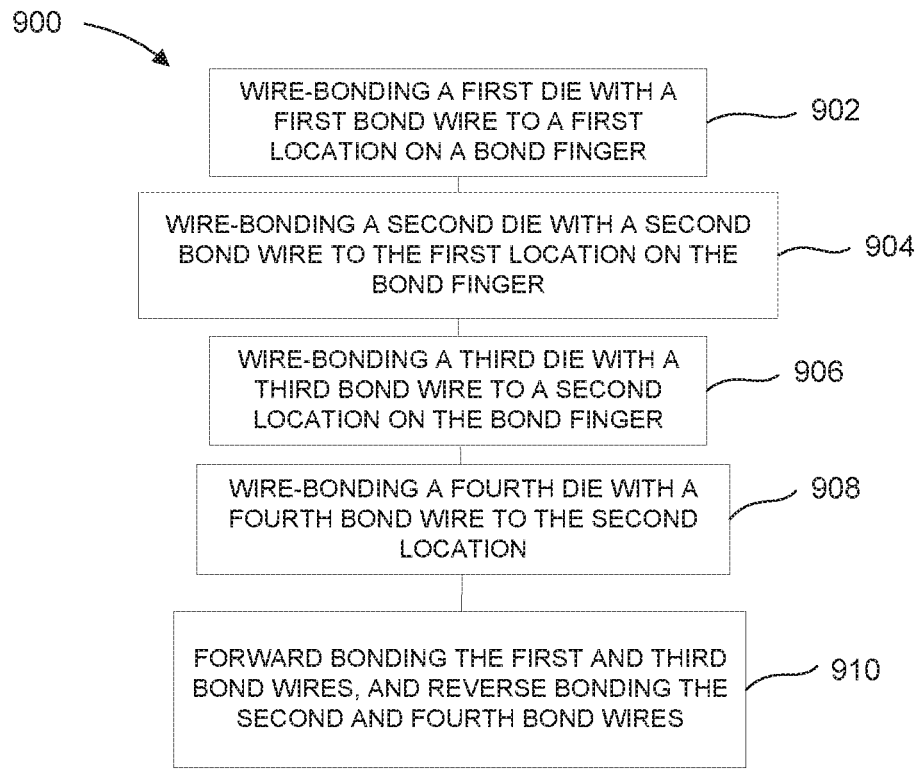
FIG. 9 shows a method of making an electronic device package in accordance with an example.

FIG. 9 shows a method 900 for making an electronic device, which may include step 902 of wire-bonding a first die with a first bond wire to a first location on a bond finger. Step 904 may include wire-bonding a second die with a second bond wire to the first location on the bond finger. Step 906 may include wire-bonding a third die with a third bond wire to a second location on the bond finger. Step 908 may include wire-bonding a fourth die with a fourth bond wire to the second location. Step 910 may include forward bonding the first and third bond wires, and reverse bonding the second and fourth bond wires.

EXAMPLES

The following examples pertain to further embodiments.

In one example there is provided, an electronic device comprising: a substrate having a bond finger; a die coupled to the substrate and having a bond pad; a first bond wire coupled between the bond pad and the bond finger; and a second bond wire coupled between the bond pad and the bond finger.

In one example of an electronic device, at least one of the bond wires is coupled to the bond pad with a bond pad solder ball.

In one example of an electronic device, both of the bond wires are coupled to the bond pad with a bond pad solder ball.

In one example of an electronic device, at least one of the bond wires is directly coupled to the bond pad.

In one example of an electronic device, both of the bond wires are directly coupled to the bond pad.

In one example of an electronic device, at least one of the bond wires is coupled to the bond finger with a bond finger solder ball.

In one example of an electronic device, both of the bond wires are coupled to the bond finger with a bond finger solder ball.

In one example of an electronic device, at least one of the bond wires is directly coupled to the bond finger.

In one example of an electronic device, both of the bond wires are directly coupled to the bond finger.

In one example of an electronic device, the first bond wire is coupled to the bond pad with a first bond pad solder ball and the second bond wire is coupled to the bond pad with a second bond pad solder ball.

In one example of an electronic device, the second bond pad solder ball is coupled to the first bond pad solder ball.

In one example of an electronic device, the second bond pad solder ball does not contact the bond pad.

In one example of an electronic device, the first bond wire is coupled to the bond finger with a first bond finger solder ball and the second bond wire is coupled to the bond finger with a second bond finger solder ball.

In one example of an electronic device, the second bond finger solder ball is coupled to the first bond finger solder ball.

In one example of an electronic device, the second bond finger solder ball does not contact the bond finger.

In one example of an electronic device, the first bond wire is coupled to the bond finger with a bond finger solder ball and the second bond wire is directly coupled to the bond finger.

In one example of an electronic device, the first bond wire is coupled to the bond pad with a first bond pad solder ball and to the bond finger with a first bond finger solder ball.

In one example of an electronic device, the first bond wire is coupled to the bond pad with a first bond pad solder ball and is coupled directly to the bond finger.

In one example of an electronic device, the first bond wire is directly coupled to the bond pad and is coupled to the bond finger with a first bond finger solder ball.

In one example of an electronic device, the first bond wire is directly coupled to both the bond pad and the bond finger.

In one example of an electronic device, the second bond wire is coupled to the bond pad with a second bond pad solder ball and to the bond finger with a second bond finger solder ball.

In one example of an electronic device, the second bond wire is coupled to the bond pad with a second bond pad solder ball and is coupled directly to the bond finger.

In one example of an electronic device, the second bond wire is directly coupled to the bond pad and is coupled to the bond finger with a second bond finger solder ball.

In one example of an electronic device, the second bond wire is directly coupled to both the bond pad and the bond finger.

In one example of an electronic device, a second die is coupled to the substrate and having a bond pad and a first bond wire coupled between the second die bond pad and the bond finger.

In one example of an electronic device, a second bond wire is coupled between the second die bond pad and the bond finger.

In one example of an electronic device, at least one of the bond wires is coupled to the second die bond pad with a bond pad solder ball.

In one example of an electronic device, both of the bond wires are coupled to the second die bond pad with a bond pad solder ball.

In one example of an electronic device, at least one of the bond wires is directly coupled to the second die bond pad.

In one example of an electronic device, both of the bond wires are directly coupled to the second die bond pad.

In one example of an electronic device, at least one of the bond wires is coupled to the bond finger with a bond finger solder ball.

In one example of an electronic device, both of the bond wires are coupled to the bond finger with a bond finger solder ball.

In one example of an electronic device, at least one of the bond wires is directly coupled to the bond finger.

In one example of an electronic device, both of the bond wires are directly coupled to the bond finger.

In one example of an electronic device, the first bond wire is coupled to the second bond pad with a first bond pad solder ball and the second bond wire is coupled to the second bond pad with a second bond pad solder ball.

In one example of an electronic device, the second bond pad solder ball is coupled to the first bond pad solder ball.

In one example of an electronic device, the second bond pad solder ball does not contact the second die bond pad.

In one example of an electronic device, the first bond wire is coupled to the bond finger with a first bond finger solder ball and the second bond wire is coupled to the bond finger with a second bond finger solder ball.

In one example of an electronic device, the second bond finger solder ball is coupled to the first bond finger solder ball.

In one example of an electronic device, the second bond finger solder ball does not contact the bond finger.

In one example of an electronic device, the first bond wire is coupled to the bond finger with a bond finger solder ball and the second bond wire is directly coupled to the bond finger.

In one example of an electronic device, the first bond wire is coupled to the second die bond pad with a first bond pad solder ball and to the bond finger with a first bond finger solder ball.

In one example of an electronic device, the first bond wire is coupled to the second bond pad with a first bond pad solder ball and is coupled directly to the bond finger.

In one example of an electronic device, the first bond wire is directly coupled to the second die bond pad and is coupled to the bond finger with a first bond finger solder ball.

In one example of an electronic device, the first bond wire is directly coupled to both the second die bond pad and the bond finger.

In one example of an electronic device, the second bond wire is coupled to the second bond pad with a second bond pad solder ball and to the bond finger with a second bond finger solder ball.

In one example of an electronic device, the second bond wire is coupled to the second bond pad with a second bond pad solder ball and is coupled directly to the bond finger.

In one example of an electronic device, the second bond wire is directly coupled to the second die bond pad and is coupled to the bond finger with a second bond finger solder ball.

In one example of an electronic device, the second bond wire is directly coupled to both the second die bond pad and the bond finger.

In one example of an electronic device, the second die is directly coupled to the substrate.

In one example of an electronic device, the second device is disposed on the first die.

In one example there is provided, an electronic device comprising: a substrate having a bond finger; a first die coupled to the substrate and having a first die bond pad; a second die coupled to the substrate and having a second die bond pad; a first bond wire coupled between the first die bond pad and the bond finger; and a second bond wire coupled between the second die bond pad and the bond finger at a substantially same location as the first bond wire.

In one example of an electronic device, the first bond wire is either directly coupled to the first die bond pad, or coupled to the first die bond pad with a solder ball.

In one example of an electronic device, the second bond wire is either directly coupled to the second die bond pad, or coupled to the second die bond pad with a solder ball.

In one example of an electronic device, the first bond wire is coupled to the bond finger with a solder ball.

In one example of an electronic device, the second bond wire contacts the bond finger solder ball.

In one example of an electronic device, the second bond wire is either coupled to the second die bond pad with the bond finger solder ball, or directly coupled to the second die bond pad.

In one example of an electronic device, the bond finger has a surface area has a size that is about two or less times an area calculated by addition of circular areas of each bond finger solder ball at a largest circumference point.

In one example of an electronic device, the bond finger surface area size is about 1.5 or less times the calculated area.

In one example of an electronic device, the bond finger area size is about equivalent to the calculated area.

In one example there is provided, a process of electrically coupling a die to a substrate comprising: wire-bonding a bond finger of a substrate to a bond pad of a die with a first bond wire; and wire-bonding the bond finger to the bond pad with a second bond wire, such that the first and second bond wires electrically couple the bond pad to the bond finger.

In one example of a process of electrically coupling a die to a substrate, wire-bonding the first bond wire comprises reverse bonding the first bond wire from the bond finger to the bond pad.

In one example of a process of electrically coupling a die to a substrate, the first bond wire is either directly coupled to the bond finger or coupled to the bond finger with a bond finger solder ball, and is either directly coupled to the bond pad or coupled to the bond pad with a bond pad solder ball.

In one example of a process of electrically coupling a die to a substrate, the first bond wire is coupled to the bond finger with a bond finger solder ball and to the bond pad with a bond pad solder ball.

In one example of a process of electrically coupling a die to a substrate, wire-bonding the second bond wire comprises either forward bonding or reverse bonding the second bond wire from the bond finger to the bond pad.

In one example of a process of electrically coupling a die to a substrate, wire-bonding the second bond wire comprises forward bonding the second bond wire from the bond pad to the bond finger.

In one example of a process of electrically coupling a die to a substrate, the second bond wire is either directly coupled to the bond pad or coupled to the bond pad with a bond pad solder ball, and is either directly coupled to the bond finger, or coupled to the bond finger with a bond finger solder ball.

In one example of a process of electrically coupling a die to a substrate, the second wire bond is coupled to the bond pad with a solder ball and directly coupled to the bond finger.

In one example of a process of electrically coupling a die to a substrate, the first bond wire is coupled to the bond pad with a first bond pad solder ball and to the bond finger with a first bond finger solder ball and the second bond wire is coupled to the bond pad with a second bond pad solder ball and directly coupled to the bond finger.

In one example of a process of electrically coupling a die to a substrate, the first bond pad solder ball is coupled to the second bond pad solder ball.

In one example there is provided, a method of minimizing a bond finger area on a substrate comprising: electrically coupling a plurality of wires between at least one die and a substantially single spot on the bond finger.

In one example of a method minimizing bond finger area on a substrate, the plurality of wires is at least two wires.

In one example of a method minimizing bond finger area on a substrate, the plurality of wires is more than two wires.

In one example of a method minimizing bond finger area on a substrate, the at least one die is one die and the plurality of wires is coupled to a bond pad on the die.

In one example of a method minimizing bond finger area on a substrate, the at least one die is a plurality of dies and at least one wire is coupled to a bond pad of each die.

Circuitry used in electronic components or devices (e.g. a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in device or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. An electronic device comprising:
   a substrate having a bond finger;
   a die coupled to the substrate and having a bond pad;
   a first bond wire coupled between the bond pad and the bond finger, wherein the first bond wire is coupled to the bond pad with a bond pad solder ball, and wherein the first bond wire is coupled to the bond finger with a bond finger solder ball; and
   a second bond wire coupled between the bond pad and the bond finger, wherein the second bond wire is coupled to the bond pad with a second bond pad solder ball, and wherein the second bond pad solder ball is coupled to the bond pad solder ball.

2. The electronic device of claim 1, wherein the second bond wire is directly coupled to the bond finger.

3. The electronic device of claim 1, wherein the second bond pad solder ball does not contact the bond pad.

4. The electronic device of claim 1, further comprising a second die coupled to the substrate and having a second bond pad and a third bond wire coupled between the second die bond pad and the bond finger.

5. The electronic device of claim 4, further comprising a fourth bond wire coupled between the second die bond pad and the bond finger.

6. The electronic device of claim 5, wherein at least one of the third or fourth bond wires is coupled to the second die bond pad with a bond pad solder ball.

7. The electronic device of claim 6, wherein both of the third and fourth bond wires are coupled to the second die bond pad with a bond pad solder ball.

8. The electronic device of claim 4, wherein at least one of the third or fourth bond wires is coupled to the bond finger with a bond finger solder ball.

9. The electronic device of claim 4, wherein at least one of the third or fourth bond wires is directly coupled to the bond finger.

10. The electronic device of claim 5, wherein the third bond wire is coupled to the second bond pad with a third bond pad solder ball and the fourth bond wire is coupled to the second bond pad with a fourth bond pad solder ball.

11. The electronic device of claim 10, wherein the fourth bond pad solder ball is coupled to the third bond pad solder ball.

12. The electronic device of claim 11, wherein the fourth bond pad solder ball does not contact the second die bond pad.

13. The electronic device of claim 5, wherein the third bond wire is coupled to the bond finger with a bond finger solder ball and the fourth bond wire is directly coupled to the bond finger.

14. The electronic device of claim 5, wherein the third bond wire is coupled to the second die bond pad with a bond pad solder ball and to the bond finger with a bond finger solder ball.

15. The electronic device of claim 5, wherein the fourth bond wire is coupled to the second bond pad with a bond pad solder ball and is coupled directly to the bond finger.

16. The electronic device of claim 4, wherein the second die is disposed on the die.

17. An electronic device comprising:
a substrate having a bond finger;
a die coupled to the substrate and having a bond pad;
a first bond wire coupled between the bond pad and the bond finger, wherein the first bond wire is coupled to the bond pad with a bond pad solder ball, and wherein the first bond wire is coupled to the bond finger with a bond finger solder ball; and
a second bond wire coupled between the bond pad and the bond finger, wherein the second bond wire is coupled to the bond pad with a second bond pad solder ball, and wherein the second bond pad solder ball does not contact the bond pad.

18. An electronic device comprising:
a substrate having a bond finger;
a die coupled to the substrate and having a bond pad;
a first bond wire coupled between the bond pad and the bond finger, wherein the first bond wire is coupled to the bond pad with a bond pad solder ball, and wherein the first bond wire is coupled to the bond finger with a bond finger solder ball; and
a second bond wire coupled between the bond pad and the bond finger, wherein the second bond wire is directly coupled to the bond finger.

* * * * *